United States Patent
Tsunoda

(10) Patent No.: US 10,756,512 B2
(45) Date of Patent: Aug. 25, 2020

(54) DRIVING CIRCUIT AND OPTICAL MODULE

(71) Applicant: FUJITSU LIMITED, Kawasaki-shi, Kanagawa (JP)

(72) Inventor: Yukito Tsunoda, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/396,821

(22) Filed: Apr. 29, 2019

(65) Prior Publication Data

US 2019/0386459 A1 Dec. 19, 2019

(30) Foreign Application Priority Data

Jun. 13, 2018 (JP) .................. 2018-112730

(51) Int. Cl.
*H01S 3/00* (2006.01)
*H01S 5/068* (2006.01)
*H01S 5/042* (2006.01)
*H01S 5/00* (2006.01)
*H01S 5/062* (2006.01)

(52) U.S. Cl.
CPC ........ *H01S 5/06825* (2013.01); *H01S 5/0085* (2013.01); *H01S 5/042* (2013.01); *H01S 5/0428* (2013.01); *H01S 5/06216* (2013.01)

(58) Field of Classification Search
CPC .... H01S 5/042; H01S 5/06825; H01S 5/0085; H01S 5/0428; H01S 5/06216
See application file for complete search history.

(56) References Cited

U.S. PATENT DOCUMENTS

| | | | | |
|---|---|---|---|---|
| 6,452,445 B1 * | 9/2002 | Nobbe | ................. | H03G 1/0023 327/563 |
| 7,280,574 B1 * | 10/2007 | Khawshe | ................ | H01S 5/042 372/38.02 |
| 7,684,452 B1 * | 3/2010 | Draper | ................... | H01S 5/042 372/38.02 |
| 2005/0195870 A1 * | 9/2005 | Moran | ................... | H01S 5/042 372/38.02 |

FOREIGN PATENT DOCUMENTS

JP 11-004033 1/1999

* cited by examiner

*Primary Examiner* — Kinam Park
(74) *Attorney, Agent, or Firm* — Fujitsu Patent Center

(57) ABSTRACT

A driving circuit includes a first transistor that includes a first terminal, a second terminal, and a third terminal; a second transistor having a fourth terminal, a fifth terminal, and a sixth terminal; and an output portion that outputs a signal between the second transistor and a second current source to a light emitting element, wherein the first terminal is coupled to a first power source, a signal is input to the second terminal, and the third terminal is grounded through a first current source which is different from the second current source, and the fourth terminal is coupled to a second power source which is the same as or different from the first power source via the second current source, the fifth terminal is coupled to a voltage source or a bias circuit, and the sixth terminal is coupled between the first transistor and the first current source.

15 Claims, 10 Drawing Sheets

DRIVING CIRCUIT AND OPTICAL MODULE

CROSS-REFERENCE TO RELATED APPLICATION

This application is based upon and claims the benefit of priority of the prior Japanese Patent Application No. 2018-112730, filed on Jun. 13, 2018, the entire contents of which are incorporated herein by reference.

FIELD

The embodiments discussed herein are related to a driving circuit of a light emitting element, and an optical module.

BACKGROUND

An existing driving circuit that drives a light emitting element such as a semiconductor laser has been known. For example, a light emitting element driving circuit has been known in which a switch circuit turning ON/OFF in accordance with an input data signal and a current source supplying a driving current to a light emitting element when a switch is turned ON are connected in series.

For example, in a single end-type driving circuit formed by combining an emitter follower and an emitter grounding circuit, a current source may not be installed on the ground side of the emitter grounding circuit. Therefore, there is a problem that resistance to voltage variation of a power source of the driving circuit is low and a driving signal is deteriorated due to occurrence of the voltage variation of the power source.

By contrast, the configuration in which a differential-type driving circuit is employed and a current source is installed on and ground side of the emitter grounding circuit of a differential pair may also be considered. In the differential-type driving circuit, for example, one differential signal drives the light emitting element whereas the other differential signal drives a dummy of the light emitting element for good balance of the differential pair. Therefore, there arises a problem that power consumption is increased.

The following is a reference document.
[Document 1] Japanese Laid-open Patent Publication No. 11-4033.

SUMMARY

According to an aspect of the embodiments, a driving circuit includes a first transistor that includes a first terminal as a collector, a second terminal as a base, and a third terminal as an emitter; a second transistor having a fourth terminal as a collector, a fifth terminal as a base, and a sixth terminal as an emitter; and an output portion that outputs a signal between the second transistor and a second current source to a light emitting element, wherein the first terminal is coupled to a first power source, a signal is input to the second terminal, and the third terminal is grounded through a first current source which is different from the second current source, and the fourth terminal is coupled to a second power source which is the same as or different from the first power source via the second current source, the fifth terminal is coupled to a voltage source or a bias circuit, and the sixth terminal is coupled between the first transistor and the first current source.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, embodiments of a driving circuit and an optical module according to the embodiments will be described in detail with reference to the drawings.

Figure 1:
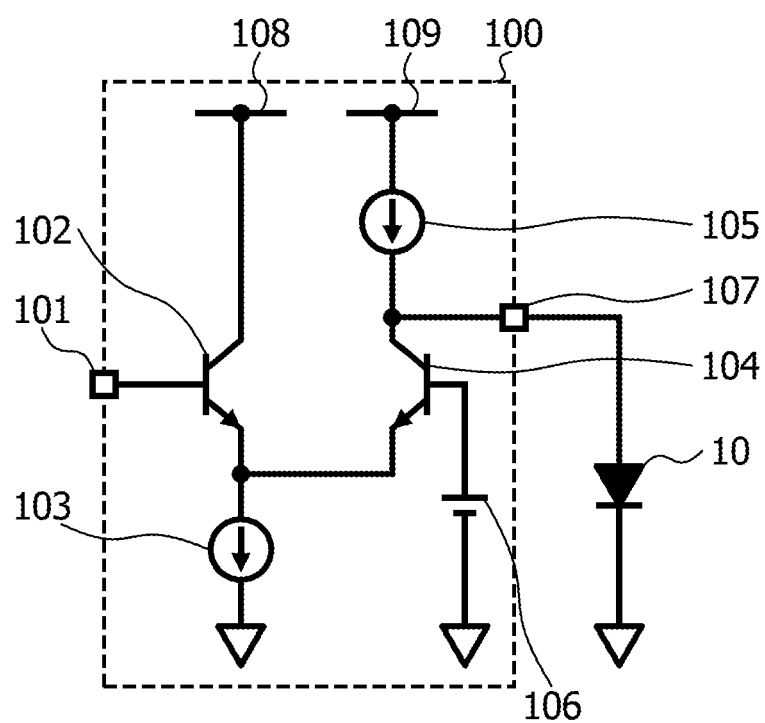
FIG. 1 is a diagram illustrating an example of a driving circuit according to a first embodiment.

First Embodiment (Driving Circuit According to First Embodiment)
FIG. 1 is a diagram illustrating an example of a driving circuit according to a first embodiment. A driving circuit 100 according to the first embodiment illustrated in FIG. 1 generates a driving signal for driving a light emitting element 10 based on an input signal. As illustrated in FIG. 1, the driving circuit 100 includes an input portion 101, a transistor 102, a current source 103, a transistor 104, a current source 105, a voltage source 106, an output portion 107, and power source lines 108 and 109. The input signal to the driving circuit 100 is input to the input portion 101.

The transistor 102 includes, for example, a bipolar transistor, and has a collector (first terminal), a base (second terminal), and an emitter (third terminal). The base of the transistor 102 is connected to the input portion 101. The collector of the transistor 102 is connected to the power source line 108. The emitter of the transistor 102 is connected to the current source 103. As described above, the transistor 102 is an emitter follower (collector grounding circuit) in which the collector is a common terminal, the base is an input terminal, the emitter is an output terminal, and the current source 103 is connected to the emitter.

One terminal of the current source 103 is connected to the emitter of the transistor 102 and the other terminal thereof is grounded. That is, for example, the emitter of the transistor 102 is grounded through the current source 103.

The transistor 104 includes, for example, a bipolar transistor, and has a collector (fourth terminal), a base (fifth terminal), and an emitter (sixth terminal). The base of the transistor 104 is connected to the voltage source 106. The collector of the transistor 104 is connected to the current source 105. The emitter of the transistor 104 is connected between the emitter of the transistor 102 and the current source 103. As described above, the transistor 104 is a base grounding circuit in which the base is a common terminal, the emitter is an input terminal, the collector is an output terminal, and the current source 105 is connected to the collector.

The current source 105 is a bias current source for making the bias of the driving signal output from the driving circuit 100 being fixed. For example, one terminal of the current source 105 is connected to the collector of the transistor 104 and the other terminal thereof is connected to the power source line 109. That is, for example, the collector of the transistor 104 is connected to the power source (power source line 109) through the current source 105.

The voltage source 106 is a fixed-voltage power source one terminal of which is connected to the base of the transistor 104 and the other terminal of which is grounded. The voltage source 106 may be a power source connected to the power source line 108 or 109, which will be described later, or may be a power source differing from the power source connected to the power source line 108 or 109.

The output portion 107 is connected between the collector of the transistor 104 and the current source 105, and outputs a current, as the driving signal, flowing between the collector of the transistor 104 and the current source 105 to the light emitting element 10. The light emitting element 10 will be described later (for example, see FIG. 2).

Each of the power source lines 108 and 109 is connected to a power source (not illustrated) of the driving circuit 100. The power source lines 108 and 109 may be connected to the same power source each other or may be connected to different power sources each other.

For example, in an existing single end-type driving circuit formed by combining an emitter follower and an emitter grounding circuit, when a current source is installed on the ground side of the emitter grounding circuit, the emitter grounding circuit does not operate as an amplifier and is incapable of driving the light emitting element. Therefore, in the existing single end-type driving circuit formed by combining the emitter follower and the emitter grounding circuit, the current source may not be installed on the ground side of the emitter grounding circuit.

By contrast, the driving circuit 100 illustrated in FIG. 1 has the configuration in which the emitter follower (transistor 102) having the emitter to which the current source 103 is connected and the base grounding circuit (transistor 104) are connected in series and the output signal of the base grounding circuit is output as the driving signal. Accordingly, the current source 103 on the ground side of the emitter follower (transistor 102) may also be used as a current source on the ground side of the base grounding circuit (transistor 104) while driving the light emitting element 10.

With this configuration, resistance to voltage variation of the power source (power source connected to the power source line 108 when the different power sources are connected to the power source lines 108 and 109) connected to the power source lines 108 and 109 may be improved. Therefore, even with the voltage variation of the power source, deterioration in the driving signal which is output from the driving circuit 100 to the light emitting element 10 may be suppressed.

The driving circuit 100 is the single end-type driving circuit. The single end-type driving circuit is a driving circuit which amplifies a single end signal by, for example, one amplifier or a plurality of amplifiers (transistor 102 and transistor 104 illustrated as examples in FIG. 1) connected in series. The single end signal represents, for example, data by a voltage level with reference to a predetermined voltage (for example, 0 [V]).

That is, for example, the driving circuit 100 is not a differential-type driving circuit that drives a dummy of the light emitting element 10 together with the light emitting element 10 as disclosed in Japanese Laid-open Patent Publication No 2012-80061 but the single end-type driving circuit that does not drive the dummy of the light emitting element 10, thereby suppressing power consumption. The single end-type driving circuit 100 enables the power consumption to be reduced to approximately ½ of that of the differential-type driving circuit, for example.

(Optical Module to which Driving Circuit According to First Embodiment is Applied)

Figure 2:
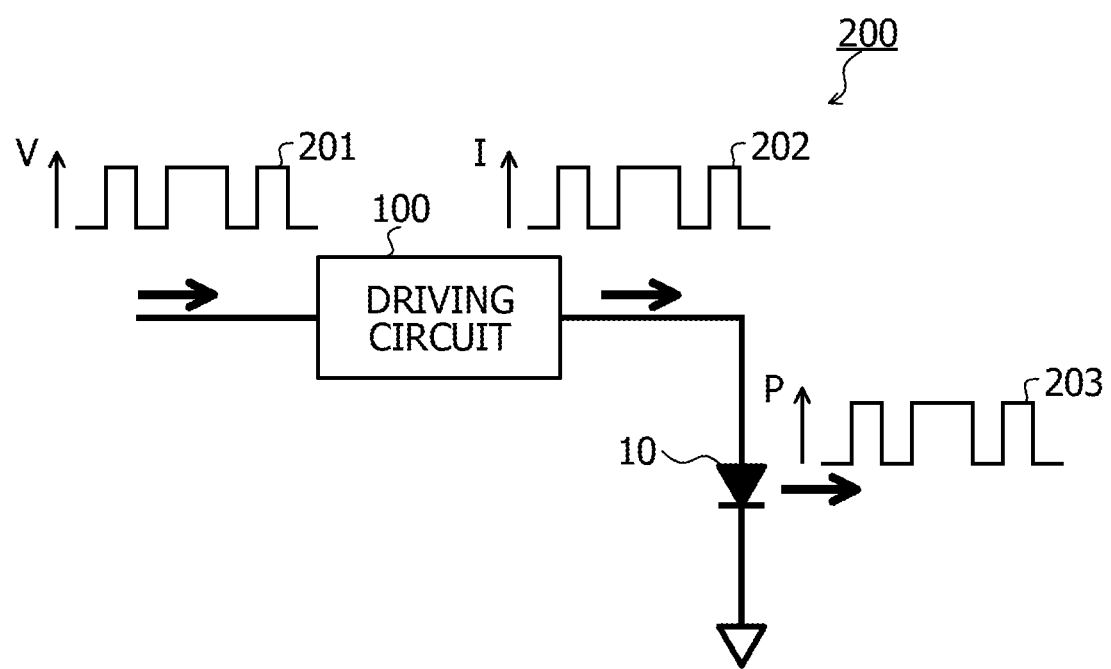
FIG. 2 is a diagram illustrating an example of an optical module to which the driving circuit according to the first embodiment is applied.

FIG. 2 is a diagram illustrating an example of an optical module to which the driving circuit according to the first embodiment is applied. An optical module 200 illustrated in FIG. 2 includes, for example, the driving circuit 100 and the light emitting element 10 illustrated in FIG. 1. An input signal 201 is input to the driving circuit 100. The input signal 201 is, for example, a voltage signal representing switching of ON and OFF ("1" and "0") by variation of a voltage [V].

The driving circuit 100 generates a driving signal 202 based on the input signal 201 and outputs the generated driving signal 202 to the light emitting element 10. The driving signal 202 is a signal generated by adjusting a voltage or current of the input signal 201 for efficiently driving the light emitting element 10 and is, for example, a current signal representing the switching of ON and OFF, as well as the input signal 201, by variation of a current [I].

One terminal (for example, anode) of the light emitting element 10 is connected to the driving circuit 100 and the other terminal (for example, cathode) thereof is grounded. The light emitting element 10 generates an optical signal 203 in accordance with the driving signal 202 output from the driving circuit 100 and emits the generated optical signal 203. The optical signal 203 is, for example, an optical signal representing the switching of ON and OFF, as well as the driving signal 202, by variation of optical power [P].

As an example, a vertical cavity surface emitting laser (VCSEL) may be used for the light emitting element 10. The light emitting element 10 is not limited to the VCSEL and various types of semiconductor lasers (laser diode: LD) may be used therefor.

As illustrated in FIG. 2, the optical module 200 is a direct-modulation optical transmission device that directly drives the light emitting element 10 with the driving signal representing the switching of ON and OFF, therefore, may be realized by a simple configuration. Although the configuration in which the driving circuit 100 illustrated in FIG. 1 is applied to the optical module 200 has been described above, driving circuits 100, which will be described later, may also be applied to the optical module 200.

(AOC to which Optical Module According to First Embodiment is Applied)

Figure 3:
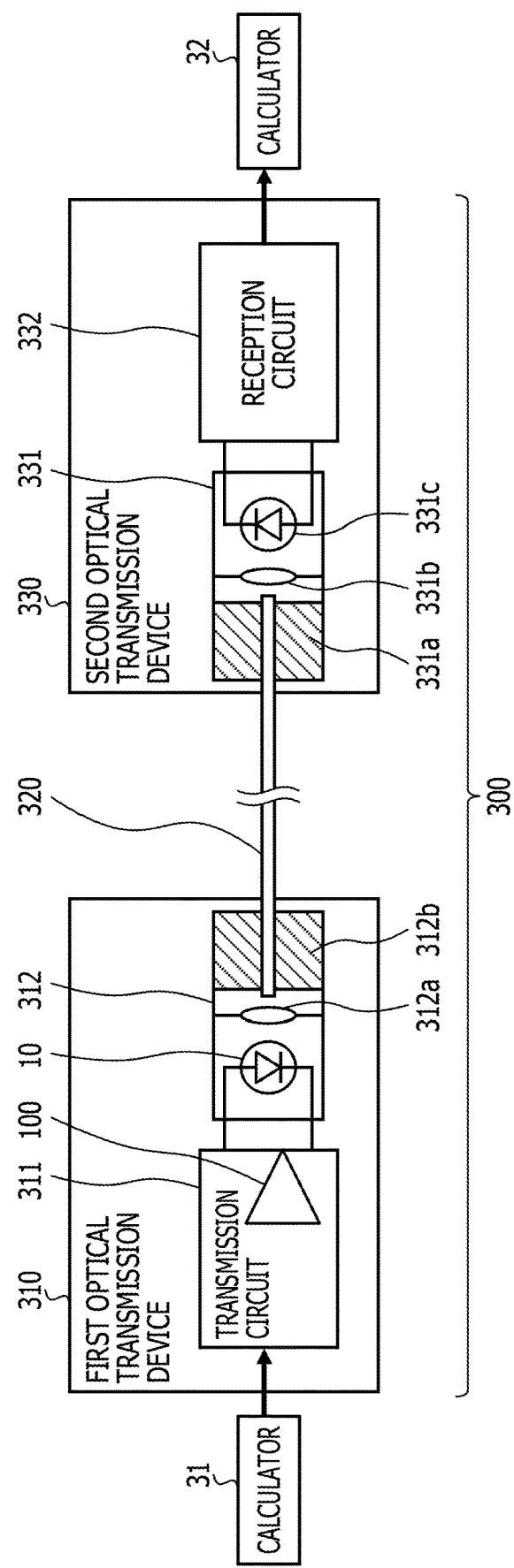
FIG. 3 is a diagram illustrating an example of an active optical cable (AOC) to which the optical module according to the first embodiment is applied.

FIG. 3 is a diagram illustrating an example of an AOC to which the optical module according to the first embodiment is applied. In FIG. 3, the same reference numerals denote the same components as the components illustrated in FIGS. 1 and 2 and description thereof is omitted. The optical module 200 illustrated in FIG. 2 may be applied to, for example, an AOC 300 illustrated in FIG. 3. The AOC is an abbreviation for an active optical cable. The AOC 300 is an optical module formed by integrating a first optical transmission device 310, an optical fiber cable 320, and a second optical transmission device 330.

The first optical transmission device 310 is connectable to a connector installed in a calculator 31. The first optical transmission device 310 converts an electric signal output from the calculator 31 connected thereto with the connector into an optical signal and transmits the converted optical signal to the second optical transmission device 330 through the optical fiber cable 320. For example, the first optical transmission device 310 includes a transmission circuit 311 and an electro-optical conversion module 312.

The transmission circuit 311 generates a driving signal for driving the light emitting element 10 of the electro-optical conversion module 312, which will be described later, based on the electric signal output from the calculator 31. For example, the transmission circuit 311 includes the above-described driving circuit 100 as an output driver at a final stage or near the final stage. The transmission circuit 311 outputs the driving signal generated by the driving circuit 100 to the electro-optical conversion module 312. The transmission circuit 311 may include an encoding circuit that encodes the electric signal output from the first optical transmission device 310 so as to correspond to optical transmission by the AOC 300. In this case, the driving circuit 100 generates the driving signal based on the electric signal encoded by the encoding circuit.

The electro-optical conversion module 312 converts the driving signal output from the transmission circuit 311 into an optical signal and transmits the converted optical signal to the optical fiber cable 320. The electro-optical conversion module 312 includes, for example, the light emitting element 10, a lens 312a, and a fiber holding portion 312b. The light emitting element 10 generates the optical signal in accordance with the driving signal output from the transmission circuit 311 and emits the generated optical signal to the lens 312a.

The lens 312a collects the optical signal emitted from the light emitting element 10 to an end portion of the optical fiber cable 320 fixed to the inside of the electro-optical conversion module 312. The optical signal emitted from the driving circuit 100 is thereby transmitted to the optical fiber cable 320. The fiber holding portion 312b holds the end portion of the optical fiber cable 320 on the first optical transmission device 310 side so as to fix it to the inside of the electro-optical conversion module 312.

The first optical transmission device 310 may include a plurality of combinations of the transmission circuits 311 and the electro-optical conversion modules 312 and be capable of transmitting a plurality of optical signals. In this case, the first optical transmission device 310 may include a distribution circuit that divides the electric signal output from the calculator 31 into a plurality of signals and distributes each of the divided signals to each of the plurality of transmission circuits 311.

The optical fiber cable 320 is a cable including an optical fiber connecting the first optical transmission device 310 and the optical fiber cable 320. For example, the optical fiber cable 320 passes through the optical signal transmitted from the first optical transmission device 310 and causes the passed optical signal to be incident on the second optical transmission device 330. When the first optical transmission device 310 is capable of transmitting the plurality of optical signals, the optical fiber cable 320 may be a cable including a plurality of optical fibers passing through the plurality of optical signals transmitted from the first optical transmission device 310.

The second optical transmission device 330 is connectable to a connector installed in a calculator 32. The second optical transmission device 330 converts the optical signal transmitted from the first optical transmission device 310 through the optical fiber cable 320 into an electric signal and outputs the converted electric signal to the calculator 32 connected thereto with the connector. For example, the second optical transmission device 330 includes a photoelectric conversion module 331 and a reception circuit 332.

The photoelectric conversion module 331 converts the optical signal that has passed through the optical fiber cable 320 into the electric signal and outputs the converted electric signal to the reception circuit 332. The photoelectric conversion module 331 includes, for example, a fiber holding portion 331a, a lens 331b, and a light receiving element 331c. The fiber holding portion 331a holds an end portion of the optical fiber cable 320 on the second optical transmission device 330 side so as to fix it to the inside of the photoelectric conversion module 331.

The lens 331b collects the optical signal emitted from the end portion of the optical fiber cable 320, which is fixed to the inside of the photoelectric conversion module 331, to the light receiving element 331c. The light receiving element 331c receives the optical signal collected by the lens 331b, generates the electric signal in accordance with the received optical signal, and outputs the generated electric signal to the reception circuit 332.

The reception circuit 332 performs reception processing on the electric signal output from the photoelectric conversion module 331 and outputs the electric signal obtained by the reception processing to the calculator 32. For example, the reception circuit 332 includes a TIA and performs processing of converting the electric signal output from the photoelectric conversion module 331 into a voltage signal from a current signal by the TIA. TIA is an abbreviation for a transimpedance amplifier. The reception circuit 332 may include, for example, a decoding circuit and perform, as the reception processing, decoding corresponding to the above-described encoding circuit.

When the plurality of optical signals is transmitted from the first optical transmission device 310 through the optical fiber cable 320, the second optical transmission device 330 may have a plurality of combinations of the photoelectric conversion modules 331 and the reception circuits 332 and be capable of receiving the plurality of optical signals. In this case, the second optical transmission device 330 may include a coupling circuit that couples each of the electric signals output from the plurality of reception circuits 332 and outputs the coupled electric signal to the calculator 32.

Although the configuration in which the optical signal is transmitted to the optical fiber cable 320 from the first optical transmission device 310 in the AOC 300 has been described, the configuration may transmit the optical signals between the first optical transmission device 310 and the second optical transmission device 330 bidirectionally. For example, an optical signal based on an electric signal output from the calculator 32 is transmitted to the first optical transmission device 310 through the optical fiber cable 320 by providing the configuration of the first optical transmission device 310 illustrated in FIG. 3 also in the second optical transmission device 330.

In this case, the optical fiber cable 320 includes an optical fiber passing through the optical signal that is transmitted from the second optical transmission device 330 to the first optical transmission device 310. Furthermore, in this case, the optical signal transmitted from the second optical transmission device 330 through the optical fiber cable 320 is converted into an electric signal and the converted electric signal is output to the calculator 31 by providing the configuration of the second optical transmission device 330 illustrated in FIG. 3 also in the first optical transmission device 310.

(Another Example of Driving Circuit According to First Embodiment)

Figure 4:
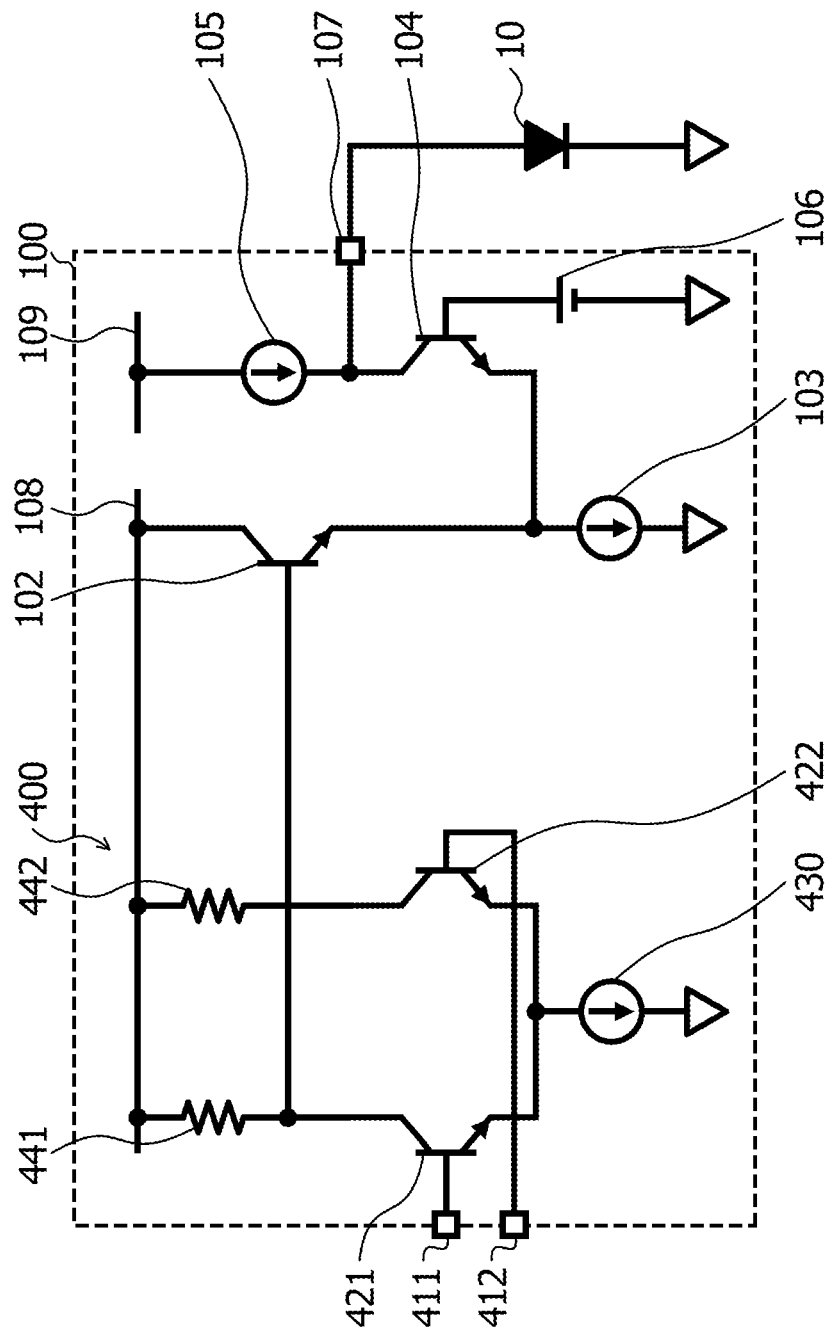
FIG. 4 is a diagram illustrating another example of the driving circuit according to the first embodiment.

FIG. 4 is a diagram illustrating another example of the driving circuit according to the first embodiment. In FIG. 4, the same reference numerals denote the same components as the components illustrated in FIG. 1 and description thereof is omitted. As illustrated in FIG. 4, the driving circuit 100 according to the first embodiment may include a differential amplifier circuit 400 instead of the input portion 101 illustrated in FIG. 1.

The differential amplifier circuit 400 differentially amplifies an input signal. For example, the differential amplifier circuit 400 includes input portions 411 and 412, transistors 421 and 422, a current source 430, and resistors 441 and 442. The input signal to the driving circuit 100 as differential signals is input to the input portions 411 and 412. For example, a positive-phase signal of the input signal to the driving circuit 100 is input to the input portion 411. A negative-phase signal (inverted signal of positive-phase signal) of the input signal to the driving circuit 100 is input to the input portion 412.

Each of the transistors 421 and 422 is, for example, a bipolar transistor. A base of the transistor 421 is connected to the input portion 411. A collector of the transistor 421 is connected to the resistor 441. An emitter of the transistor 421 is connected to the current source 430. A base of the transistor 422 is connected to the input portion 412. A collector of the transistor 422 is connected to the resistor 442. An emitter of the transistor 422 is connected to the current source 430. As described above, each of the transistors 421 and 422 is an emitter grounding circuit in which the emitter is a common terminal, the base is an input terminal, and the collector is an output terminal.

One terminal of the current source 430 is connected to the emitters of the transistors 421 and 422 and the other terminal thereof is grounded. One terminal of the resistor 441 is connected to the power source line 108 and the other terminal thereof is connected to the collector of the transistor 421. One terminal of the resistor 442 is connected to the power source line 108 and the other terminal thereof is connected to the collector of the transistor 422.

The base (input terminal) of the transistor 102 is connected between the collector of the transistor 421 and the resistor 441 in the example illustrated in FIG. 4. With this configuration, a positive-phase signal of differential signals obtained by differentially amplifying the differential signals input to the input portions 411 and 412 by the transistors 421 and 422 may be an input signal to the transistor 102.

As illustrated in FIG. 4, the driving circuit 100 may be configured to perform amplification on the input signal by the differential amplifier circuit 400 at a previous stage of the transistor 102. For example, the differential amplifier circuit 400 is installed as a protection circuit (buffer) that protects each of the circuits at subsequent stages with a limiter function of limiting an amplitude of the input signal.

As described above, the driving circuit 100 according to the first embodiment includes the transistor 102 (first transistor) having the base to which the input signal is input, the collector connected to the power source, and the emitter grounded through the current source 103 (first current source). The driving circuit 100 further includes the transistor 104 (second transistor) having the emitter connected between the transistor 102 and the current source 103, the collector connected to the power source through the current source 105 (second current source), and the base connected to the voltage source 106. The driving circuit 100 outputs, as the driving signal, the signal between the transistor 104 and the current source 105 to the light emitting element 10.

With this configuration, the current source 103 on the ground side of the transistor 102 on the input side is caused to operate also as the current source on the ground side of the transistor 104 on the output side, thereby suppressing deterioration in the driving signal due to voltage variation of the power source. The deterioration in the driving signal due to the voltage variation of the power source may be suppressed in the single end-type driving circuit even if the differential-type driving circuit is not employed, thereby suppressing increase in power consumption. Accordingly, the driving circuit 100 according to the first embodiment may suppress the deterioration in the driving signal due to the voltage variation of the power source while suppressing the increase in the power consumption.

Second Embodiment

Different parts from the first embodiment will be described for a second embodiment. In the first embodiment, the configuration in which the base of the transistor 104 (second transistor) connected to the voltage source 106 is described and in the second embodiment, a configuration in which a bias circuit connected to the base of the transistor 104 will be described.

(Driving Circuit According to Second Embodiment)

Figure 5:
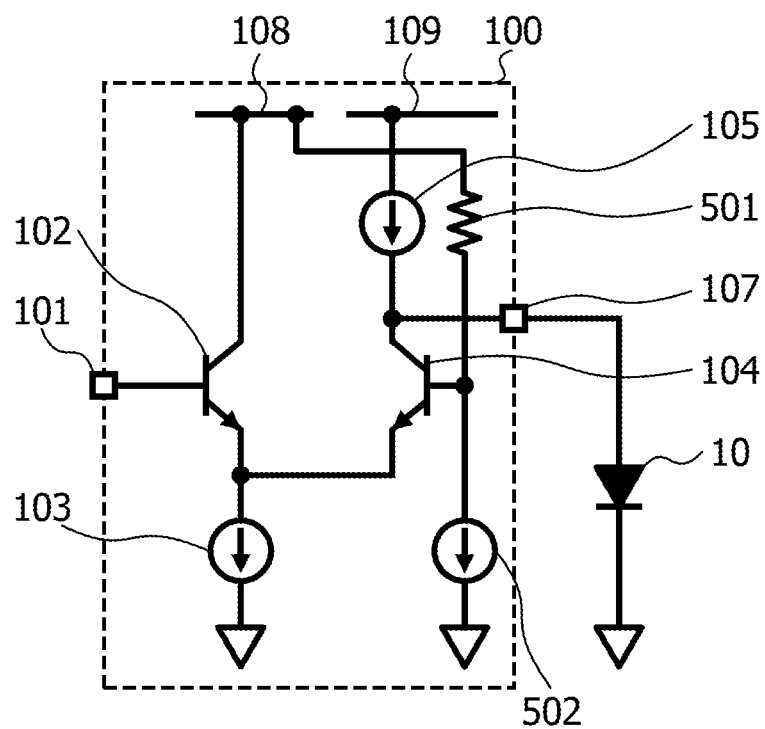
FIG. 5 is a diagram illustrating an example of a driving circuit according to a second embodiment.

FIG. 5 is a diagram illustrating an example of a driving circuit according to the second embodiment. In FIG. 5, the same reference numerals denote the same components as the components illustrated in FIG. 1. As illustrated in FIG. 5, the driving circuit 100 according to the second embodiment includes a resistor 501 and a current source 502 as the bias circuit instead of the voltage source 106 illustrated in FIG. 1.

One terminal of the resistor 501 is connected to the power source line 108 and the other terminal thereof is connected to the current source 502. One terminal of the current source 502 is connected to the resistor 501 and the other terminal thereof is grounded. The base of the transistor 104 is connected between the resistor 501 and the current source 502. That is, for example, the resistor 501 and the current source 502 operate as the bias circuit that generates a bias voltage (base bias) to be supplied to the base of the transistor 104.

The base bias generated by the bias circuit is different from the voltage generated by the voltage source 106 illustrated as an example in FIG. 1 and interlocks to variation of the power source line 108 to which the transistor 102 and the like are connected. With the configuration illustrated in FIG. 5, even when voltage variation of the input signal caused by the variation of the power source line 108 from the input portion 101 occurs, the base voltage of the transistor 104 may be cancelled by being interlocked to the voltage variation of the input signal from the input portion 101 whereby deterioration in the driving signal which is output from the output portion 107 due to the variation of the power source voltage of the power source line 108 may be suppressed. Even when the power source lines 108 and 109 are connected to different power sources each other, in a case where voltages in each of the power sources connected by the power source lines 108 and 109 are interlocked, the base bias may be interlocked to the variation of the power source line 108.

(Another Example of Driving Circuit According to Second Embodiment)

Figure 6:
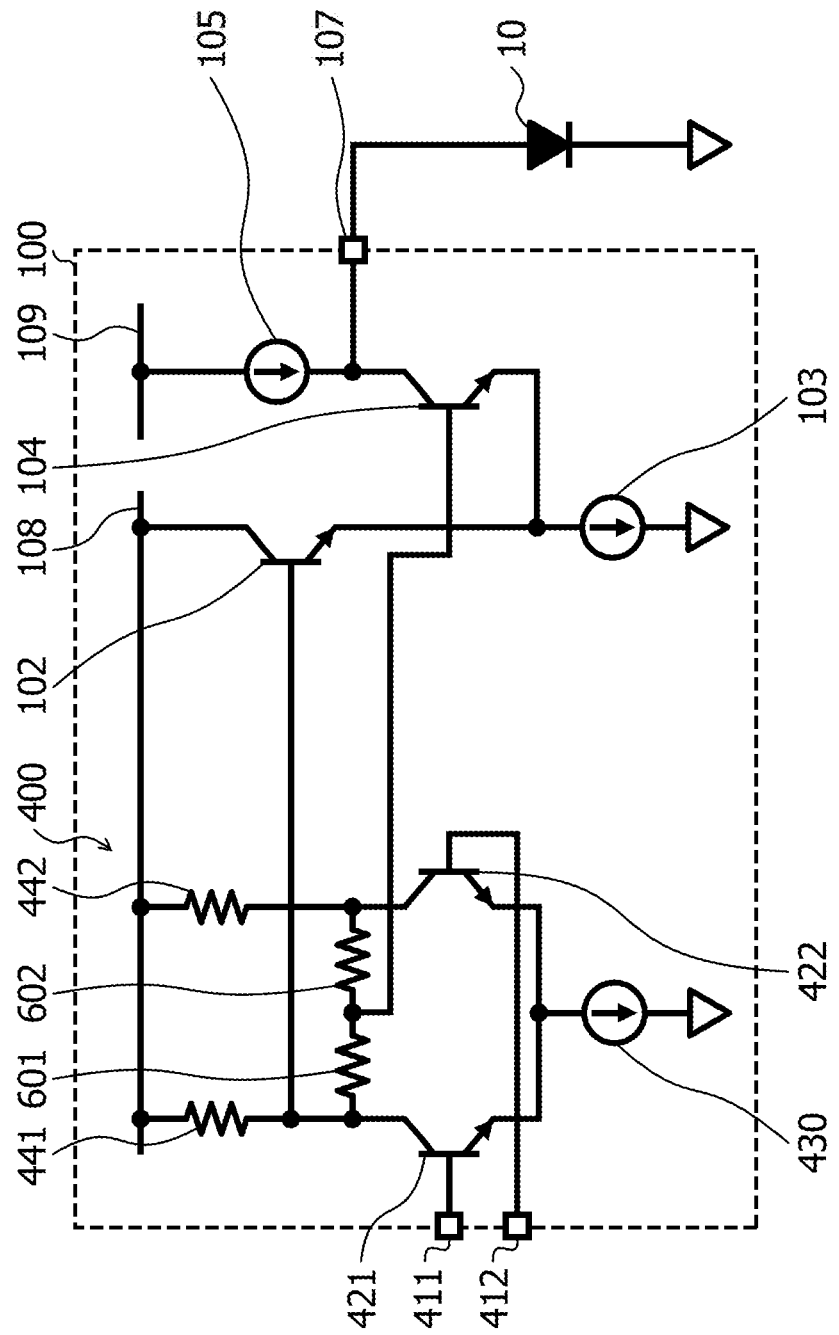
FIG. 6 is a diagram illustrating another example of the driving circuit according to the second embodiment.

FIG. 6 is a diagram illustrating another example of the driving circuit according to the second embodiment. In FIG. 6, the same reference numerals denote the same components as the components illustrated in FIG. 4 and description thereof is omitted. As illustrated in FIG. 6, the driving circuit 100 according to the second embodiment may include resistors 601 and 602 as a bias circuit instead of the voltage source 106 illustrated in FIG. 4. One terminal of the resistor 601 is connected between the collector of the transistor 421 and the resistor 441 and the other terminal thereof is connected to the resistor 602. One terminal of the resistor 602 is connected between the collector of the transistor 422 and the resistor 442 and the other terminal thereof is connected to the resistor 601.

The base (input terminal) of the transistor 104 is connected between the resistors 601 and 602 in the example illustrated in FIG. 6. A voltage between the resistors 601 and 602, that is, for example, an intermediate output when the collectors each other of the transistors 421 and 422 are divided into two by the resistors 601 and 602 is a fixed voltage obtained by adding differential signals provided by differential amplification of the differential amplifier circuit 400. Accordingly, the fixed voltage obtained by adding the differential signals provided by the differential amplification by the differential amplifier circuit 400 may be supplied as a base bias to the base of the transistor 104.

The base bias is, for example, different from the voltage generated by the voltage source 106 illustrated in FIG. 1, and interlocks to variation of the power source line 108 to which the transistor 421, 422 or the like are connected. With the configuration illustrated in FIG. 6, deterioration in the driving signal which is output from the output portion 107 due to variation of the base voltage of the transistor 104 may be suppressed in the same manner as the configuration illustrated in FIG. 5.

The configuration illustrated in FIG. 6 enables the base bias of the transistor 104 to be generated using the configuration of the differential amplifier circuit 400 at the previous stage even without installing the resistor 501 and the current source 502 illustrated in FIG. 5, for example. Therefore, the driving circuit 100 including the differential amplifier circuit 400 at the previous stage may suppress the deterioration in the driving signal which is output from the output portion 107 due to the variation of the base voltage of the transistor 104 while suppressing increase in circuit scale.

As described above, in the driving circuit 100 according to the second embodiment, the base of the transistor 104 is connected to the bias circuit (for example, resistor 501 and current source 502 illustrated in FIG. 5) that supplies the bias voltage in accordance with the voltage of the power source of the transistor 102 and the like. With this configuration, the base voltage of the transistor 104 may be caused to link to the voltage variation of the output signal from the transistor 102 due to the voltage variation of the power source of the transistor 102 and the like. Therefore, in addition to the deterioration in the driving signal due to the above-described voltage variation of the power source, the deterioration in the driving signal due to the variation of the base voltage of the transistor 104 may be suppressed.

The driving circuit 100 according to the second embodiment may include the differential amplifier circuit 400 that differentially amplifies the input signal by a common power source to that of the transistor 102 and the like at a previous stage relative to the transistor 102. In this case, the above-described bias circuit may be a circuit (for example, the resistors 601 and 602 illustrated in FIG. 6) that generates the bias voltage by adding the positive-phase signal and the negative-phase signal provided by the differential amplification by the differential amplifier circuit 400. With this configuration, the bias circuit may be realized using the differential amplifier circuit 400 at the previous stage relative to the transistor 102 even without installing the resistor 501 and the current source 502 illustrated in FIG. 5, for example, thereby suppressing increase in the circuit scale.

Third Embodiment

Different parts from the first and second embodiments will be described for a third embodiment. In the third embodiment, the configuration in which edge parts of a driving signal are emphasized using an output signal of the differential amplifier circuit 400 will be described.

(Driving Circuit According to Third Embodiment)

Figure 7:
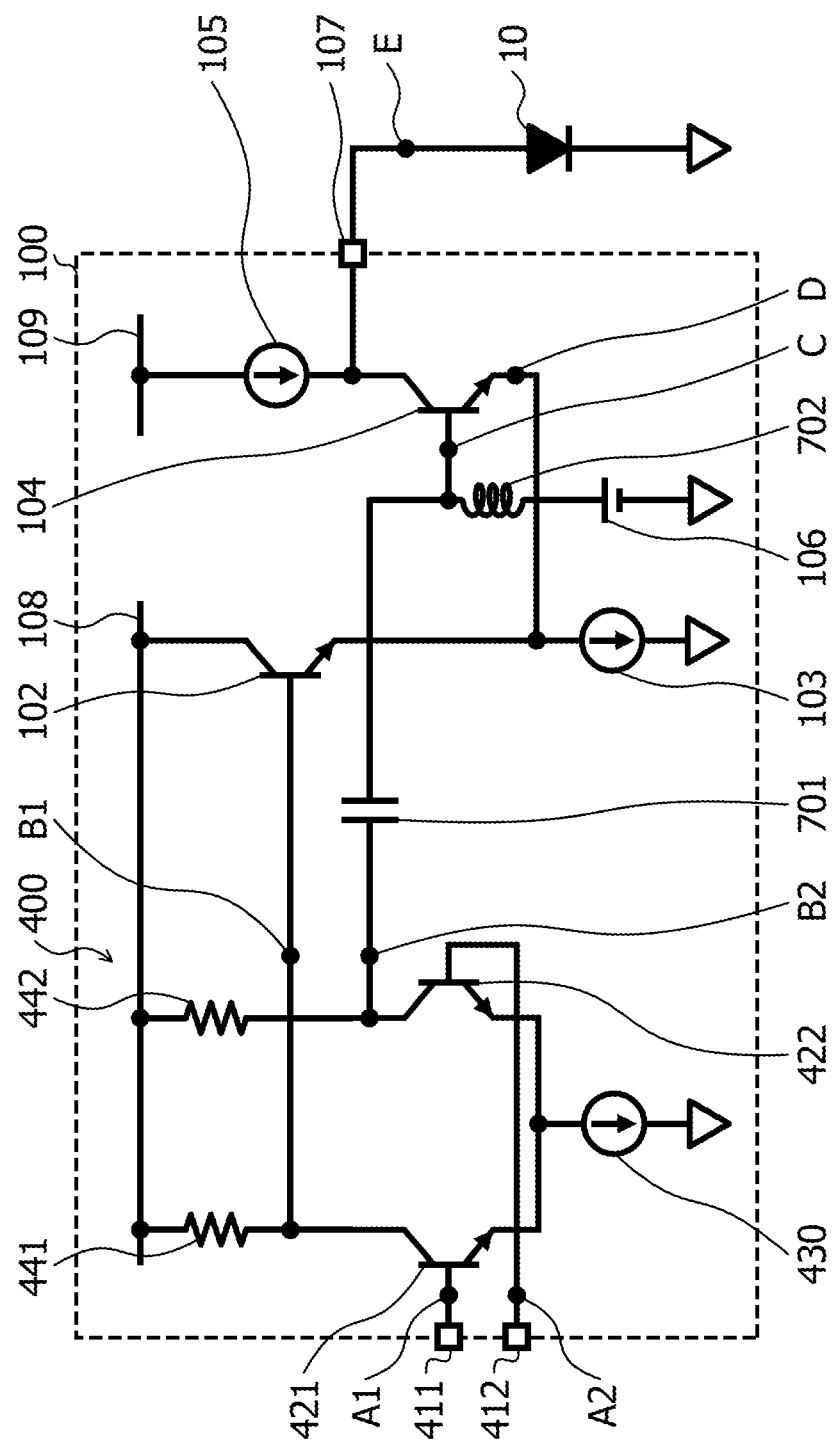
FIG. 7 is a diagram illustrating an example of a driving circuit according to a third embodiment.

FIG. 7 is a diagram illustrating an example of a driving circuit according to the third embodiment. In FIG. 7, the same reference numerals denote the same components as the components illustrated in FIG. 4 and description thereof is omitted. As illustrated in FIG. 7, the driving circuit 100 according to the third embodiment includes a capacitor 701 and an inductor 702 in addition to the configuration illustrated in FIG. 4.

One terminal of the capacitor 701 is connected between the resistor 442 and the collector of the transistor 422 and the other terminal thereof is connected to the base of the transistor 104. Capacitive coupling of the capacitor 701 enables a high-frequency component of a negative-phase signal obtained by differential amplification of the differential amplifier circuit 400 to be extracted, so that the extracted high-frequency component may be supplied to the base of the transistor 104.

With this configuration, the high-frequency component of the driving signal which is output from the collector of the transistor 104 to the light emitting element 10 with the output portion 107 interposed therebetween, which tends to be deteriorated, may be enhanced using the differential amplifier circuit 400 at the previous stage of the transistor 102. The enhancement of the high-frequency component of the driving signal indicates, for example, emphasis of the edge parts of the driving signal (see FIG. 8). The enhancement of the high-frequency component of the driving signal enables the light emitting element 10 to be driven at high speed with higher quality. For example, deterioration in edge parts of a high-speed optical signal which is generated by the light emitting element 10 may be suppressed.

One terminal of the inductor 702 is connected between the capacitor 701 and the base of the transistor 104 and the other terminal thereof is connected to the voltage source 106. The inductor 702 operates as a shield, so that the high-frequency component to be supplied to the base of the transistor 104 may be suppressed from flowing through the voltage source 106.

Next, signals flowing through points A1, A2, B1, B2, C, D, and E in the driving circuit 100 illustrated in FIG. 7 will be described.

(Signals Flowing Through Each Part in Driving Circuit According to Third Embodiment)

Figure 8:
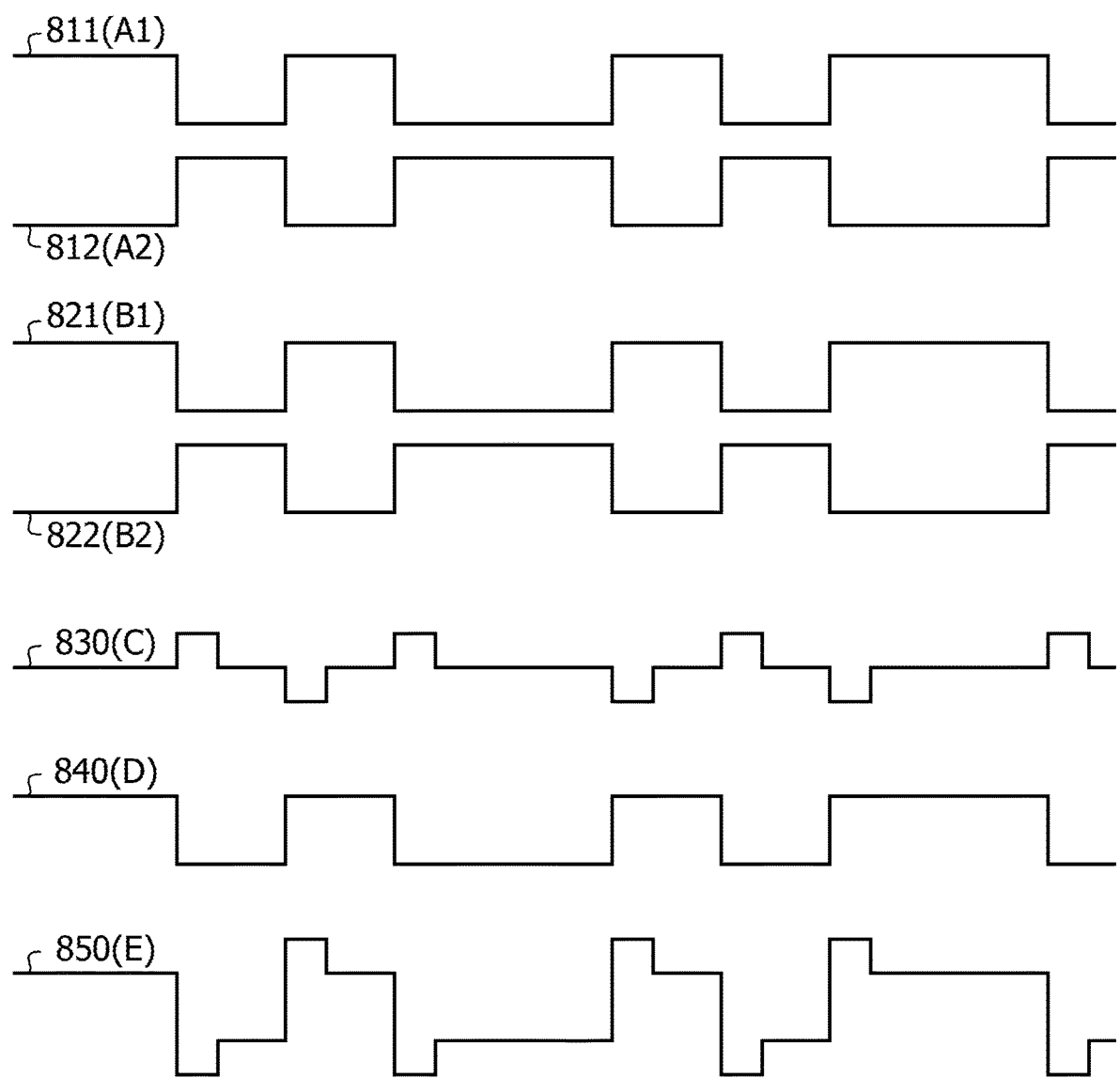
FIG. 8 is a diagram illustrating an example of signals flowing through each of the parts in the driving circuit according to the third embodiment.

FIG. 8 is a diagram illustrating an example of the signals flowing through each of the parts in the driving circuit according to the third embodiment. In FIG. 8, the transverse direction indicates time. Each of the Input signals 811 and 812 are signals flowing through the points A1 and A2 in the driving circuit 100 illustrated in FIG. 7, that is, for example, signals which are input to the input portions 411 and 412, respectively. As illustrated in FIG. 8, the input signals 811 and 812 are differential signals inverted from each other.

A positive-phase signal 821 is a signal flowing through the point B1 in the driving circuit 100 illustrated in FIG. 7, that is, for example, a positive-phase signal which is output from the differential amplifier circuit 400. A negative-phase signal 822 is a signal flowing through the point B2 in the driving circuit 100 illustrated in FIG. 7, that is, for example, a negative-phase signal which is output from the differential amplifier circuit 400. As illustrated in FIG. 8, the positive-phase signal 821 and the negative-phase signal 822 are differential signals inverted from each other.

A high-frequency component 830 is a high-frequency component extracted by the capacitor 701, from a signal flowing through the point C in the driving circuit 100 illustrated in FIG. 7, that is, for example, the negative-phase signal 822 which is output from the differential amplifier circuit 400. As illustrated in FIG. 8, the high-frequency component 830 is a signal obtained by extracting only edge parts (rising parts and falling parts) of the negative-phase signal 822.

A positive-phase signal 840 is a signal flowing through the point D in the driving circuit 100 illustrated in FIG. 7, that is, for example, a signal which is input to the emitter of the transistor 104. As illustrated in FIG. 8, the positive-phase signal 840 is a signal in accordance with the above-described positive-phase signal 821.

An output signal 850 is a signal flowing through the point E in the driving circuit 100 illustrated in FIG. 7, that is, for example, a driving signal which is output to the light emitting element 10 from the driving circuit 100. The high-frequency component 830 is input to the base of the transistor 104 and the positive-phase signal 840 is input to the emitter of the transistor 104, thereby providing the output signal 850 obtained by adding a negative phase of the high-frequency component 830 to the positive-phase signal 840, as illustrated in FIG. 8.

The output signal 850 is a signal with the emphasized (enhanced) edge parts of the positive-phase signal 840. When such output signal 850 as the driving signal is supplied to the light emitting element 10, for example, though the response speed of the light emitting element 10 is low relative to the speed of the driving signal, deterioration in the edge parts of the optical signal which is generated by the light emitting element 10 may be suppressed.

Extraction of the high-frequency component 830 from the negative-phase signal 822 out of the positive-phase signal 821 and the negative-phase signal 822 enables the output signal 850 with the emphasized edge parts of the positive-phase signal 840 to be provided even without installing an inverting circuit or the like on the input side to the base of the transistor 104. Therefore, the output signal 850 with the emphasized edge parts may be provided while suppressing increase in circuit scale due to the inverting circuit or the like and deterioration in the high-frequency component 830 due to the inverting circuit or the like.

(Another Example of Driving Circuit According to Third Embodiment)

Figure 9:
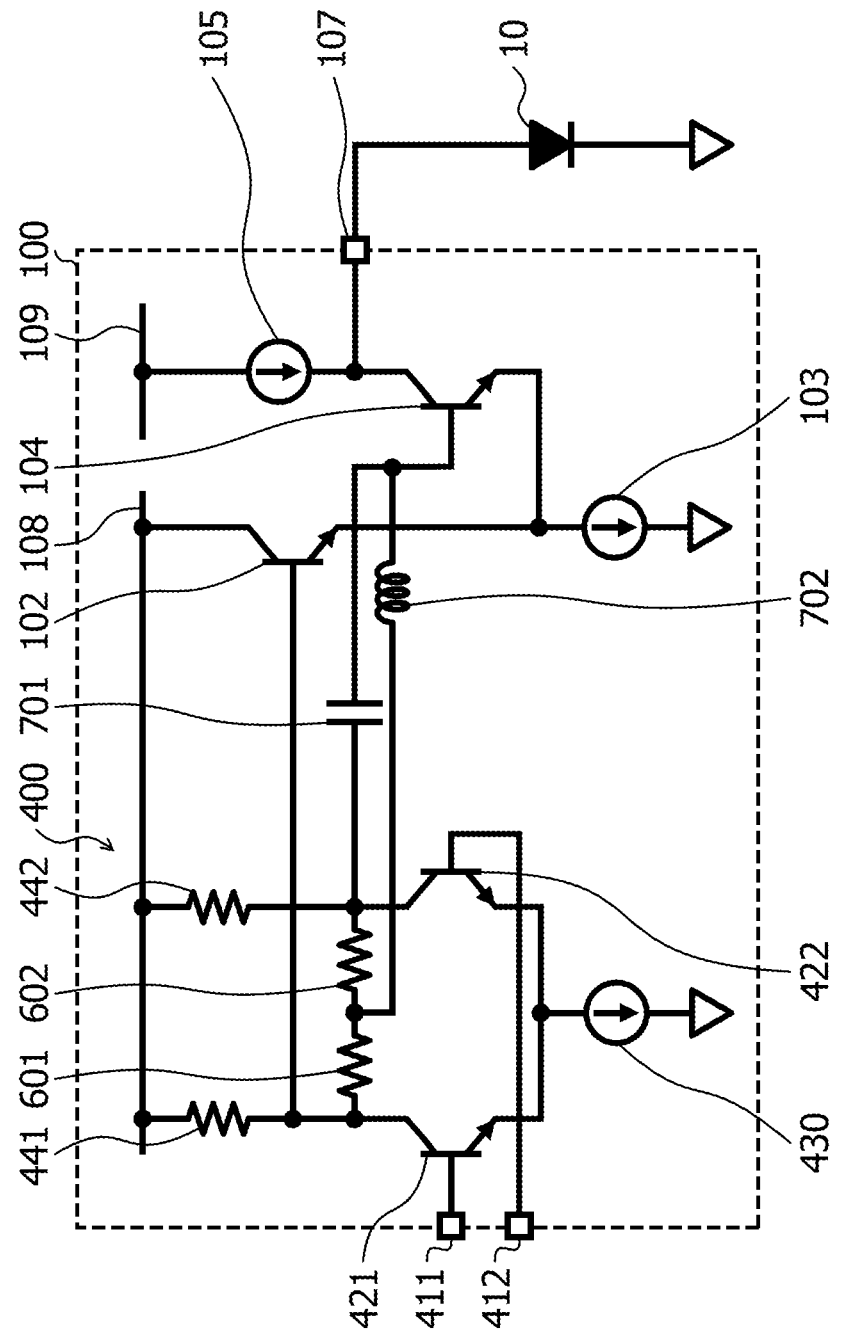
FIG. 9 is a diagram illustrating another example of the driving circuit according to the third embodiment.

FIG. 9 is a diagram illustrating another example of the driving circuit according to the third embodiment. In FIG. 9, the same reference numerals denote the same components as the components illustrated in FIGS. 6 and 7 and description thereof is omitted. As illustrated in FIG. 9, the driving circuit 100 according to the third embodiment may include the resistors 601 and 602 instead of the voltage source 106 in the driving circuit 100 illustrated in FIG. 7, similarly to the driving circuit 100 illustrated in FIG. 6.

For example, as illustrated in FIG. 9, a high-frequency component extracted from a negative-phase signal of the differential amplifier circuit 400 is supplied to the base of the transistor 104 by connecting the capacitor 701 to the base of the transistor 104. A bias voltage is supplied to the base of the transistor 104 by connecting the base of the transistor 104 between the resistors 601 and 602. The high-frequency component which is supplied to the base of the transistor 104 may be suppressed from flowing through the differential amplifier circuit 400 by installing the inductor 702 between the base of the transistor 104 and the resistors 601 and 602.

With this configuration, deterioration in the driving signal due to variation of a base voltage of the transistor 104 may be suppressed while emphasizing the edge parts of the driving signal similarly to the configuration illustrated in FIG. 7 and suppressing the increase in the circuit scale similarly to the configuration illustrated in FIG. 6.

In FIG. 9, described are the deterioration in the driving signal due to the variation of the base voltage of the transistor 104 is suppressed by including the resistors 601 and 602 instead of the voltage source 106 in the driving circuit 100 illustrated in FIG. 7, similarly to the driving circuit 100 illustrated in FIG. 6. Similarly, the deterioration in the driving signal due to the variation of the base voltage of the transistor 104 may be suppressed by including the resistor 501 and the current source 502 instead of the voltage source 106 in the configuration of the driving circuit 100 illustrated in FIG. 7, similarly to the driving circuit 100 illustrated in FIG. 5.

As described above, the driving circuit 100 according to the third embodiment includes the differential amplifier circuit 400 that differentially amplifies the input signal by a common power source to that of the transistor 102 and the like at the previous stage relative to the transistor 102. The driving circuit 100 includes an extraction circuit (for example, the capacitor 701) that extracts a high-frequency component of a signal obtained by differential amplification by the differential amplifier circuit 400 and supplies the extracted high-frequency component to the base of the transistor 104. With this configuration, the edge parts of the driving signal which is output to the light emitting element 10 may be emphasized and the quality of the optical signal which is generated by the driving circuit 100 may be improved.

Increase in circuit scale may be suppressed by extracting the high-frequency component of the signal using the differential amplifier circuit 400 at the previous stage relative to the transistor 102. Accordingly, the quality of the optical signal may be improved while suppressing the increase in the circuit scale.

Fourth Embodiment

Different parts from the first to third embodiments will be described for a fourth embodiment. Although the configuration for each of the transistors are the bipolar transistors described in the first to third embodiments, the configuration at least some of the transistors may be a field effect transistor (FET).

(Driving Circuit According to Fourth Embodiment)

Figure 10:
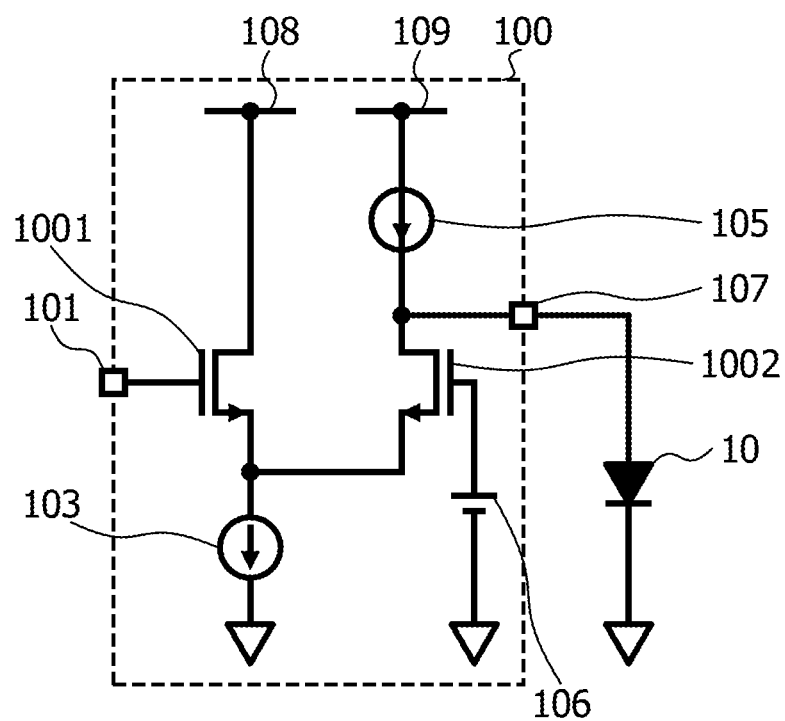
FIG. 10 is a diagram illustrating an example of a driving circuit according to a fourth embodiment.

FIG. 10 is a diagram illustrating an example of a driving circuit according to a fourth embodiment. In FIG. 10, the same reference numerals denote the same components as the components illustrated in FIG. 1 and description thereof is omitted. As illustrated in FIG. 10, the driving circuit 100 according to the fourth embodiment may include transistors 1001 and 1002 instead of the transistors 102 and 104 illustrated in FIG. 1. Each of the transistors 1001 and 1002 is, for example, the FET.

The transistor 1001 has a drain (first terminal), a gate (second terminal), and a source (third terminal). The gate of the transistor 1001 is connected to the input portion 101. The drain of the transistor 1001 is connected to the power source line 108. The source of the transistor 1001 is connected to the current source 103. As described above, the transistor 1001 is a source follower (drain grounding circuit) in which the drain is a common terminal, the gate is an input terminal, the source is an output terminal, and the current source 103 is connected to the source.

The transistor 1002 has a drain (fourth terminal), a gate (fifth terminal), and a source (sixth terminal). The gate of the transistor 1002 is connected to the voltage source 106. The drain of the transistor 1002 is connected to the current source 105. The source of the transistor 1002 is connected between the source of the transistor 1001 and the current source 103. As described above, the transistor 1002 is a gate grounding circuit in which the gate is a common terminal, the source is an input terminal, the drain is an output terminal, and the current source 105 is connected to the drain.

The driving circuit 100 according to the fourth embodiment may provide the same effects as those of the driving circuits 100 according to the above-described first to third embodiments also with the configuration using the FETs as the transistors.

That is, for example, the driving circuit 100 according to the fourth embodiment includes the transistor 1001 (first transistor) having the gate to which the input signal is input, the drain connected the power source, and the source grounded with the current source 103 (first current source) interposed therebetween. The driving circuit 100 further includes the transistor 1002 (second transistor) having the source connected to between the transistor 1001 and the current source 103, the drain connected to the power source with the current source 105 (second current source) interposed therebetween, and the gate connected to the voltage source 106. The driving circuit 100 outputs, as a driving signal, a signal between the transistor 1002 and the current source 105 to the light emitting element 10. Accordingly, similarly to the driving circuit 100 according to the first embodiment, deterioration in the driving signal due to voltage variation of a power source is suppressed while suppressing increase in power consumption.

In FIG. 10, the FETs are used for the transistors of the driving circuit 100 illustrated in FIG. 1. However, the FETs may be used for the transistors in each of the above-described driving circuits 100.

The bipolar transistor and the FET may be mixed in each of the above-described driving circuits 100. For example, the transistor 1002 (FET) may be installed instead of the transistor 104 (bipolar transistor) in the configuration of the driving circuit 100 illustrated in FIG. 1. The transistor 1001 (FET) may be installed instead of the transistor 102 (bipolar transistor) in the configuration of the driving circuit 100 illustrated in FIG. 1. The transistors 421 and 422 (bipolar transistors) may be the FETs in the configuration of the driving circuit 100 illustrated in FIG. 4. At least either of the transistors 102 and 104 (bipolar transistors) may be the FET in the configuration of the driving circuit 100 illustrated in FIG. 4.

As described above, the driving circuit and the optical module may suppress the deterioration in the driving signal due to the voltage variation of the power source.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A driving circuit comprising:
a first transistor that includes a first terminal as a collector, a second terminal as a base, and a third terminal as an emitter;
a second transistor having a fourth terminal as a collector, a fifth terminal as a base, and a sixth terminal as an emitter; and
an output portion that outputs a signal between the second transistor and a second current source to a light emitting element, wherein
the first terminal is coupled to a first power source, a signal is input to the second terminal, and the third terminal is grounded through a first current source which is different from the second current source, and
the fourth terminal is coupled to a second power source which is the same as or different from the first power source via the second current source, the fifth terminal is coupled to a voltage source or a bias circuit, and the sixth terminal is coupled between the first transistor and the first current source.

2. The driving circuit according to claim 1, wherein the driving circuit is a single end-type driving circuit.

3. The driving circuit according to claim 1, wherein the fifth terminal of the second transistor is coupled to the bias circuit that supplies a bias voltage in accordance with a voltage of the first power source.

4. The driving circuit according to claim 3, further including
a differential amplifier circuit that differentially amplifies the signal which is input to the second terminal of the first transistor by the first power source at a previous stage relative to the first transistor,
wherein the bias circuit generates the bias voltage by adding a positive-phase signal and a negative-phase signal obtained by differential amplification by the differential amplifier circuit.

5. The driving circuit according to claim 1, further including:
a differential amplifier circuit that differentially amplifies the signal which is input to the second terminal of the first transistor by the first power source at a previous stage relative to the first transistor; and
an extraction circuit that extracts a high-frequency component of a signal obtained by differential amplification by the differential amplifier circuit and supplies the extracted high-frequency component to the fifth terminal of the second transistor.

6. The driving circuit according to claim 5, further including
- an inductor one terminal of which is coupled to the voltage source or the bias circuit coupled to the fifth terminal of the second transistor and the other terminal of which is coupled to between the extraction circuit and the fifth terminal of the second transistor.

7. The driving circuit according to claim 5
wherein a positive-phase signal out of the positive-phase signal and a negative-phase signal obtained by the differential amplification of the differential amplifier circuit is input to the second terminal of the first transistor, and
the extraction circuit extracts the high-frequency component from the negative-phase signal.

8. An optical module comprising:
a first transistor that includes a first terminal as a collector, a second terminal as a base, and a third terminal as an emitter;
a second transistor having a fourth terminal as a collector, a fifth terminal as a base, and a sixth terminal as an emitter; and
a light emitting element that emits light in accordance with a signal between the second transistor and a second current source, wherein
the first terminal is coupled to a first power source, a signal is input to the second terminal, and the third terminal is grounded through a first current source which is different from the second current source, and
the fourth terminal is coupled to a second power source which is the same as or different from the first power source via the second current source, the fifth terminal is coupled to a voltage source or a bias circuit, and the sixth terminal is coupled between the first transistor and the first current source.

9. A driving circuit comprising:
a first transistor having a first terminal as a drain, a second terminal as a gate, and a third terminal as a source;
a second transistor having a fourth terminal as a drain, a fifth terminal as a gate, and a sixth terminal as a source;
an output portion that outputs a signal between the second transistor and a second current source to a light emitting element, wherein
the first terminal is coupled to a first power source, a signal is input to the second terminal, and the third terminal is grounded through a first current source which is different from the second current source, and
the fourth terminal is coupled to a second power source which is the same as or different from the first power source with a second current source, the fifth terminal is coupled to a voltage source or a bias circuit, and the sixth terminal is coupled between the first transistor and the first current source.

10. The driving circuit according to claim 9,
wherein the driving circuit is a single end-type driving circuit.

11. The driving circuit according to claim 9,
wherein the fifth terminal of the second transistor is coupled to the bias circuit that supplies a bias voltage in accordance with a voltage of the first power source.

12. The driving circuit according to claim 11, further including
a differential amplifier circuit that differentially amplifies the signal which is input to the second terminal of the first transistor by the first power source at a previous stage relative to the first transistor,
wherein the bias circuit generates the bias voltage by adding a positive-phase signal and a negative-phase signal obtained by differential amplification by the differential amplifier circuit.

13. The driving circuit according to claim 9, further including:
a differential amplifier circuit that differentially amplifies the signal which is input to the second terminal of the first transistor by the first power source at a previous stage relative to the first transistor; and
an extraction circuit that extracts a high-frequency component of a signal obtained by differential amplification by the differential amplifier circuit and supplies the extracted high-frequency component to the fifth terminal of the second transistor.

14. The driving circuit according to claim 13, further including
an inductor one terminal of which is coupled to the voltage source or the bias circuit coupled to the fifth terminal of the second transistor and the other terminal of which is coupled to between the extraction circuit and the fifth terminal of the second transistor.

15. The driving circuit according to claim 13
wherein a positive-phase signal out of the positive-phase signal and a negative-phase signal obtained by the differential amplification of the differential amplifier circuit is input to the second terminal of the first transistor, and
the extraction circuit extracts the high-frequency component from the negative-phase signal.

* * * * *